United States Patent [19]

Price

[11] 4,005,285
[45] Jan. 25, 1977

[54] OPTICAL SYSTEM FOR EXTENDING PHOTOSENSOR ARRAY RESOLUTION

[75] Inventor: Edgar E. Price, Webster, N.Y.
[73] Assignee: Xerox Corporation, Stamford, Conn.
[22] Filed: Oct. 30, 1975
[21] Appl. No.: 627,498
[52] U.S. Cl. ............................. 250/208; 250/578
[51] Int. Cl.² ........................................... H01J 39/12
[58] Field of Search .......... 250/208, 209, 578, 216, 250/201; 356/110, 109, 106

[56] References Cited

UNITED STATES PATENTS

| 2,641,712 | 6/1953 | Kircher | 250/204 |
|---|---|---|---|
| 3,285,124 | 11/1966 | Lovins | 356/110 |
| 3,555,285 | 1/1971 | Irving | 250/578 X |
| 3,875,401 | 4/1975 | Stauffer | 250/201 |
| 3,911,410 | 10/1975 | Ohta et al. | 250/578 X |

*Primary Examiner*—David C. Nelms
*Attorney, Agent, or Firm*—Robert J. Bird

[57] ABSTRACT

An optical system including a Koster's prism for splitting an optical path into twin paths so that an image propagating along the path from an object plane is incident upon one or the other of two parallel linear arrays of photosensor elements disposed in a common image plane. The arrangement provides a way to optically compact the photosensors in a continuous image line to improve the resolution of the image sensed by the photosensors.

7 Claims, 5 Drawing Figures

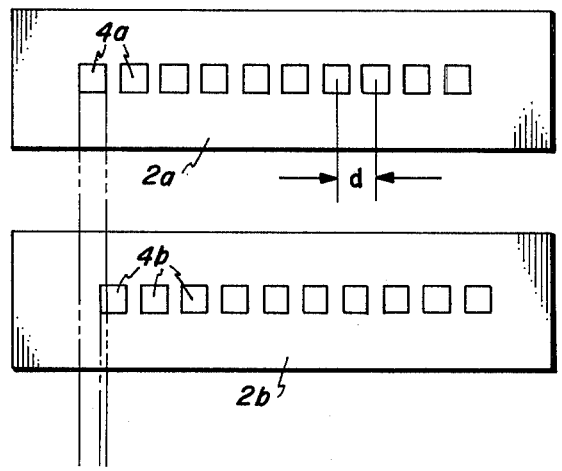
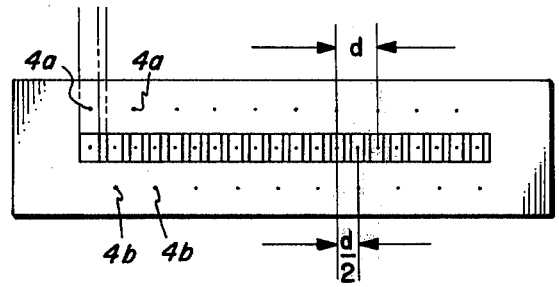
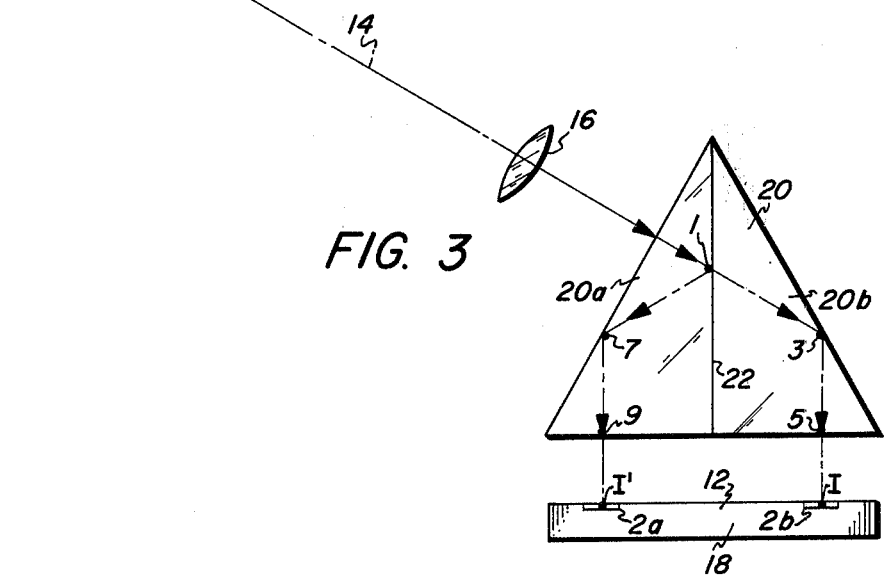

OPTICAL SYSTEM FOR EXTENDING PHOTOSENSOR ARRAY RESOLUTION

BACKGROUND OF THE INVENTION

This invention relates to linear image sensors in which light propagating from an object, and incident imagewise on a photosensor array, signals an imagewise electrical output. This invention is related to an invention disclosed in application Ser. No. 627,499, filed herewith, by Ned J. Seachman the disclosure of which is incorporated herein by reference.

The art of producing arrays of photosensors, such as charge coupled devices (CCD), is currently in development. One form of CCD arrays now being produced is limited to 256 individual photosensors in a strip or linear array. For scanning an object, for example, a 9-inch wide document, and in order to resolve five line pairs per millimeter, at least 10 photosensor elements per millimeter are necessary. This requires 254 elements per inch. Thus, nine of the 256 element arrays must be placed in a line.

It is not readily feasible to fabricate these photosensor arrays such that the end elements of two successive arrays can be physically positioned so as to create an unbroken line of photosensor elements extending across a page.

It is an object of this invention to provide a novel technique for the optical superposition of physically offset lines of photosensor arrays to create the optical equivalent of one continuous line of such photosensors.

Another object is to provide such an arrangement in which a plurality of photosensor arrays can be disposed on a common image plane, simplifying the construction of the system.

SUMMARY OF THE INVENTION

This invention is practiced in one form by an optical system including a Koster's prism for splitting an optical path into twin paths so that an image propagating along the path from an object plane is incident upon one or the other of two parallel linear arrays of photosensors elements disposed in a common image plane. The arrangement provides a way to optically compact the photosensors in a continuous image line to improve the resolution of the image sensed by the photosensors.

For a better understanding of this invention reference is made to the following more detailed description of an exemplary embodiment, given in connection with the accompanying drawing.

DRAWING

FIG. 2A is a schematic diagram of a pair of parallel linear arrays of photosensor elements longitudinally offset relative to each other by half the center-to-center spacing of individual elements.

FIG. 2B is a schematic representation of the two photosensor arrays of FIG. 2A located on a common line.

FIG. 3 is an optical diagram of an arrangement according to the present invention to optically superpose offset linear arrays of photosensors.

DESCRIPTION

Figures 1A, 1B:
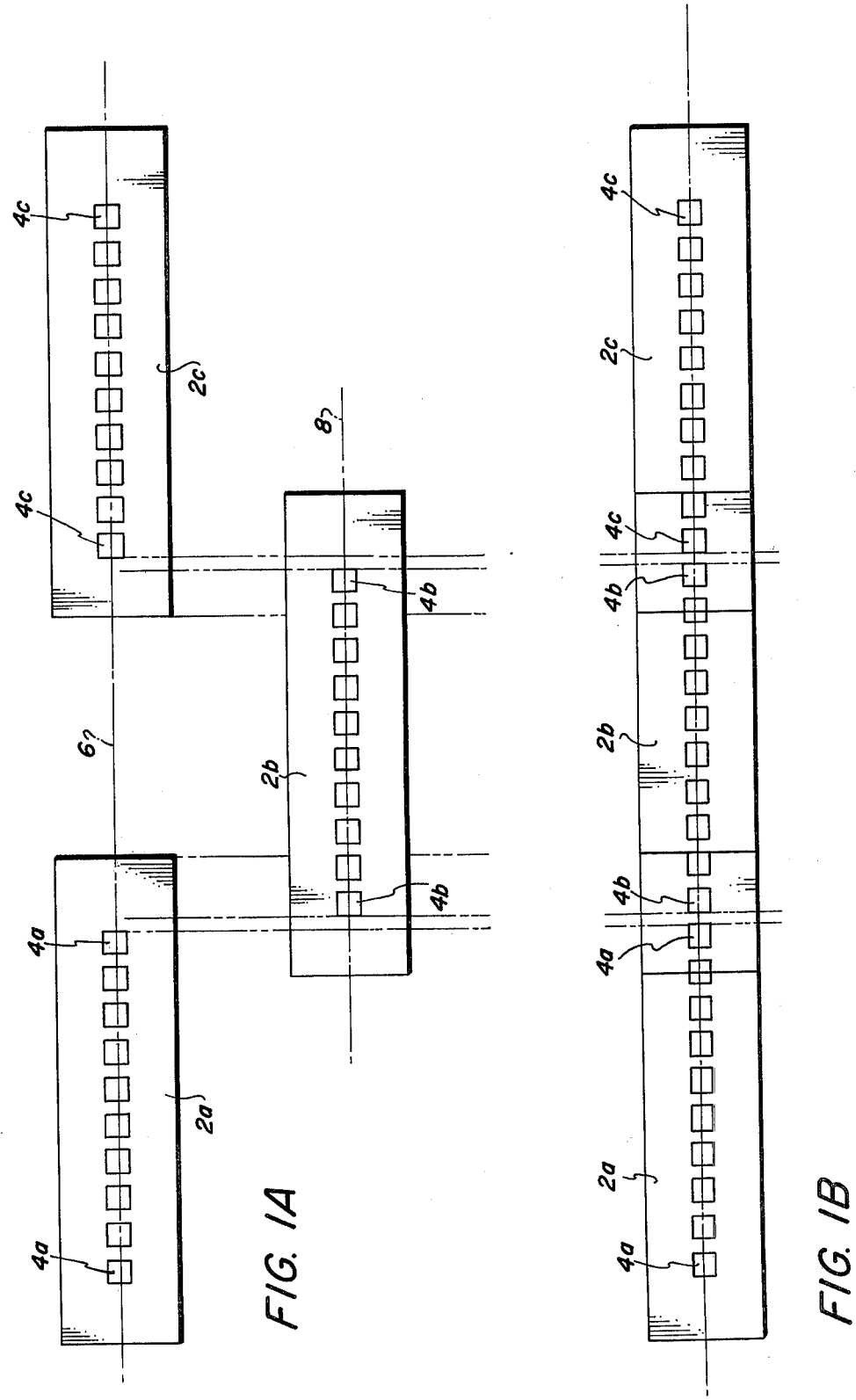
FIG. 1A is a schematic diagram of three linear arrays of photosensor elements, alternately positioned along two parallel lines.
FIG. 1B is a schematic representation of the three photosensor arrays of FIG. 1A located on a common line.

Referring now to FIG. 1A, a plurality of exemplary arrays 2 of photosensor elements 4 is schematically represented. There are ten individual photosensors shown in each array for convenience of illustration but it should be understood that these are only representative of the number of elements which are normally placed on a single array. As stated above, commonly available arrays have 256 individual photosensors, and some have more.

The arrays $2a$, $2b$, and $2c$ shown in FIG. 1A and their individual photosensors are all disposed in a common plane on a suitable support. Arrays $2a$ and $2c$ are in line along an axis 6 and array $2b$ lies along axis 8.

It is desired to arrange the arrays $2a$, $2b$, $2c$, ... $2n$ in a continuous linear array. In other words, it is desired to have the last element $4a$ be adjacent to the first element $4c$ and so on. Mechanical interference between successive arrays $2a$ and $2b$ and again between $2b$ and $2c$ obviously prevents such an alignment mechanically. The mechanical interference is represented in FIGS. 1A and 1B by the projection lines.

Referring now to FIG. 2A a similar situation is illustrated. In this case, the photosensors $4a$ in the first array $2a$ are longitudinally displaced relative to the photosensors $4b$ in the array $2b$ by half their center-to-center spacing $d$. If the two arrays could be brought together, as represented in FIG. 2B, they would overlap to form a single array of the same length but having twice the number of photosensors.

From the foregoing illustrations, it will be appreciated that neither the condition in FIG. 1B nor that in FIG. 2B can occur physically, but the optical equivalent of these conditions can exist and will now be described.

Referring now to FIG. 3, an object plane is represented at 10 and an image plane at 12, with an optical axis 14 extending therebetween. A projection lens 16 is situated so as to project an image of an object line 0 from the object plane 10 to the image plane 12. At the image plane 12, first and second photosensor arrays, $2a$ and $2b$ are represented in end view and are mounted on a suitable support or substrate 18. The photosensor arrays $2a$ and $2b$ are linearly oriented normal to the plane of the diagram as is the object line 0.

A prism 20, sometimes denominated a Koster's prism, is disposed in the optical axis 14 between the object plane 10 and the image plane 12. The Koster's prism 20 consists of two 30°–60°–90° prisms $20a$ and $20b$ cemented as shown to form an equiangular prism. The interface 22 between prism elements $20a$ and $20b$ is a beam splitter, 50% transmissive and 50% reflective of incident light.

Light propagating along the optical axis 14 of the system and incident on the beam splitter surface 22 is 50% transmitted and 50% reflected. The light transmitted at beam splitter 22 is totally internally reflected at 3 and passes out of the prism 5 to form an image at I which represents one image of object line 0 at image plane 12. The light reflected at beam splitter 22 is totally internally reflected at 7 and passes out of the prism at 9 to form an image I' which represents a second image of object line 0 at image plane 12.

In the Koster's prism 20 the optical path 1 - 3 - 5 - I is equal in length to optical path 1 - 7 - 9 - I'.

It will be appreciated that the linear object 0 has been imaged by means of the present optical system in twin image lines I and I'. By placing the linear arrays of photosensors 2a and 2b coincident with these image lines, a continuous image of a linear object 0 can be sensed. As illustrated in FIG. 2a, the arrays 2a and 2b in FIG. 3 are linearly offset by a spacing $d/2$ where $d$ represents the center-to-center spacing of photosensor elements on a single array. The effect of this is optically to compact the individual photosensor elements as represented in FIG. 2b.

Similarly, the mechanically impossible situation represented in FIG. 1 is optically achieved by the arrangement shown in FIG. 3. That is, arrays 2a, 2c, ... are aligned coincident with image I' and arrays 2b...2n are aligned coincident with image I.

It will be appreciated that by means of the novel optical technique disclosed herein, a plurality of photosensor arrays can be optically compacted for improved image resolution and further that by means of this arrangement, the entire imaging system can be placed on a single plane.

The optical system of this invention has been described in a static condition, that is, without reference to any scanning movement. A practical system employing this invention would include a scanning system in some form to effect relative scanning movement between the object and the image sensors. The details of any such scanning system are not a part of this invention.

The foregoing description of an embodiment of this invention is given by way of illustration and not of limitation. The particular geometry of the disclosed prism is not essential. Other prism geometries may be used. A cemented pair of 22 ½° - 67 ½° - 90° prisms is one example of such a prism which would work. A pair of 34° - 56° - 90° prisms is another example. A pair of 26 ½° - 63 ½° - 90° is yet another. Accordingly, the concept and scope of the invention are limited only by the following claims and equivalents thereof which may occur to others skilled in the art.

What is claimed is:

1. An image sensing system optically disposed relative to a conjugate object plane as follows:
   a plurality of discrete photosensor elements arranged in a first linear array and separated by a center-to-center spacing $d$,
   a plurality of discrete photosensor elements arranged in a second linear array and separated by a center-to-center spacing $d$,
   said first and second arrays of photosensor elements being disposed in an image plane in optical communication with said conjugate object plane,
   a beam splitter disposed in the optical path between said object plane and said image plane,
   a reflector disposed in each of the divided optical paths between said beam splitter and said image plane, said reflectors disposed in mutually inward facing relationship at an angle bisected by said beam splitter
   said first and second arrays of photosensor elements being in conjugate relationship to the same object line of said object plane, and being linearly offset relative to each other with respect to said object line by an amount $d/2$ so as to optically double the spatial density of said photosensor elements relative to said object line for increased resolution of image sensing by said elements.

2. An optical system for projecting twin images of an object from an object plane along an optical axis to an image plane, including:
   a projection lens disposed on said optical axis, to project an image with image light propagating from said object plane,
   a beam splitter disposed on said optical axis between said projection lens and said image plane to partially transmit and partially reflect image light to thereby produce twin propagating images,
   a reflector disposed on said optical axis on each side of and facing said beam splitter at equal and opposite angles relative thereto,
   a first linear array of photosensor elements disposed in said image plane to receive one of said twin images, said elements being separated by a center-to-center spacing $d$,
   a second linear array of photosensor elements disposed in said image plane to receive the other of said twin images, said elements being separated by a center-to-center spacing $d$,
   said first and second linear arrays being linearly offset relative to each other with respect to said object plane by an amount $d/2$ so as to optically double the spatial density of said photosensor elements relative to said object.

3. An optical system as defined in claim 2 in which said beam splitter is at the interface of a pair of contiguous prisms and said reflectors are internally reflecting faces of said prism.

4. An optical system for projecting twin images of an object from an object plane along an optical axis to an image plane, including:
   a projection lens disposed on said optical axis to project an image with image light propagating from said object plane,
   a prism member disposed on said optical axis between said projection lens and said image plane, said prism member including a pair of contiguous prism elements defining at their interface a beam splitter to partially transmit and partially reflect image light,
   each of said prism elements including a prism face disposed at an equal and opposite angle relative to said interface beam splitter,
   a first array of photosensor elements disposed in the image plane of and in the path of image light transmitted by said interface beam splitter, said elements of said array being separated by a center-to-center spacing $d$,
   a second array of photosensor elements disposed in the image plane of and in the path of image light reflected by said interface beam splitter, said elements of said array being separated by a center-to-center spacing $d$,
   said first and second arrays being linearly offset relative to each other with respect to said object plane by an amount $d/2$ so as to optically double the spatial density of said photosensor elements relative to said object.

5. An image sensing system optically disposed relative to a conjugate object plane as follows:
   a plurality of discrete photosensor elements arranged in a first linear array and separated by a center-to-center spacing $d$,
   a plurality of discrete photosensor elements arranged in a second linear array and separated by a center-to-center spacing $d$, said first and second arrays of photosensor elements being disposed in an image plane in optical communication with said conjugate object plane, a beam splitter disposed in the optical path between said object plane and said image plane, a reflector disposed in each of the divided optical paths between said beam splitter and said image plane, said reflectors disposed in mutually inward facing relationship at an angle bisected by said beam splitter said first and second arrays of photosensor elements being in conjugate relationship to the same object line of said object plane, said first array and said second array being linearly offset relative to each other such that the linear offset between the last element of one array and the first element of the other array is equal to the spacing d, so as to optically align said first and second arrays of photosensor elements relative to said object.

6. An optical system for projecting twin images of an object from an object plane along an optical axis to an image plane, including:

a projection lens disposed on said optical axis, to project an image with image light propagating from said object plane, a beam splitter disposed on said optical axis between said projection lens and said image plane to partially transmit and partially reflect image light to thereby produce twin propagating images, a reflector disposed on said optical axis on each side of and facing said beam splitter at equal and opposite angles relative thereto, a first linear array of photosensor elements disposed in said image plane to receive one of said twin images, said elements being separated by a center-to-center spacing $d$, a second linear array of photosensor elements disposed in said image plane to receive the other of said twin images, said elements being separated by a center-to-center spacing $d$, said first array and said second array being linearly offset relative to each other such that the linear offset between the last element of one array and the first element of the other array is equal to the spacing d, so as to optically align said first and second arrays of photosensor elements relative to said object.

7. An optical system for projecting twin images of an object from an object plane along an optical axis to an image plane, including:

a projection lens disposed on said optical axis to project an image with image light propagating from said object plane, a prism member disposed on said optical axis between said projection lens and said image plane, said prism member including a pair of contiguous prism elements defining at their interface a beam splitter to partially transmit and partially reflect image light, each of said prism elements including a prism face disposed at an equal and opposite angle relative to said interface beam splitter, a first linear array of photosensor elements disposed in the image plane of and in the path of image light transmitted by said interface beam splitter, said elements being separated by a center-to-center spacing $d$, a second linear array of photosensor elements disposed in the image plane of and in the path of image light reflected by said interface beam splitter, said elements being separated by a center-to-center spacing $d$, said first array and said second array being linearly offset relative to each other such that the linear offset between the last element of one array and the first element of the other array is equal to the spacing $d$, so as to optically align said first and second arrays of photosensor elements relative to said object.

* * * * *